(12) United States Patent
Mende

(10) Patent No.: US 6,963,196 B2
(45) Date of Patent: Nov. 8, 2005

(54) OUTPUT TERMINATION AUTO DETECTION CIRCUIT FOR AN INPUT DEVICE

(75) Inventor: Michael J. Mende, Portland, OR (US)

(73) Assignee: Tektronix, Inc., Beaverton, OR (US)

(*) Notice: Subject to any disclaimer, the term of this patent is extended or adjusted under 35 U.S.C. 154(b) by 14 days.

(21) Appl. No.: 10/658,625

(22) Filed: Sep. 8, 2003

(65) Prior Publication Data
US 2004/0100249 A1 May 27, 2004

Related U.S. Application Data

(60) Provisional application No. 60/428,647, filed on Nov. 22, 2002.

(51) Int. Cl.[7] .............................................. G01R 33/07
(52) U.S. Cl. .............................. 324/117 H; 324/117 R
(58) Field of Search ........................ 324/754, 761–762, 324/765, 633–639, 158.1; 379/361, 1.01; 340/560–664; 330/84

(56) References Cited

U.S. PATENT DOCUMENTS 3,771,038 A * 11/1973 Rubis ......................... 318/636
5,034,698 A * 7/1991 Moriyasu .................... 330/84
5,493,211 A    2/1996 Baker
6,817,760 B2 * 11/2004 Mende et al. ............... 374/152

* cited by examiner

Primary Examiner—Vinh P. Nguyen
(74) Attorney, Agent, or Firm—William K. Bucher

(57) ABSTRACT

An output termination auto detection circuit includes a reference resistance having one side coupled to a known input voltage and selectively coupled into a signal line of an input device. The other side of the reference resistance is coupled to an output terminal of the input device which is coupled to the input of a host instrument. The host instrument has an input resistance termination that functions as the output termination of the input device. A detection device is coupled to a common mode between the reference resistance and the input resistance of the host instrument for measuring the voltage at the node. Knowing the reference resistance, the input voltage and the output voltage at the node, the output termination of the input device (i.e. the input termination of the host instrument) can be determined and a indication of an improperly terminated input device may be provided to a user.

7 Claims, 3 Drawing Sheets

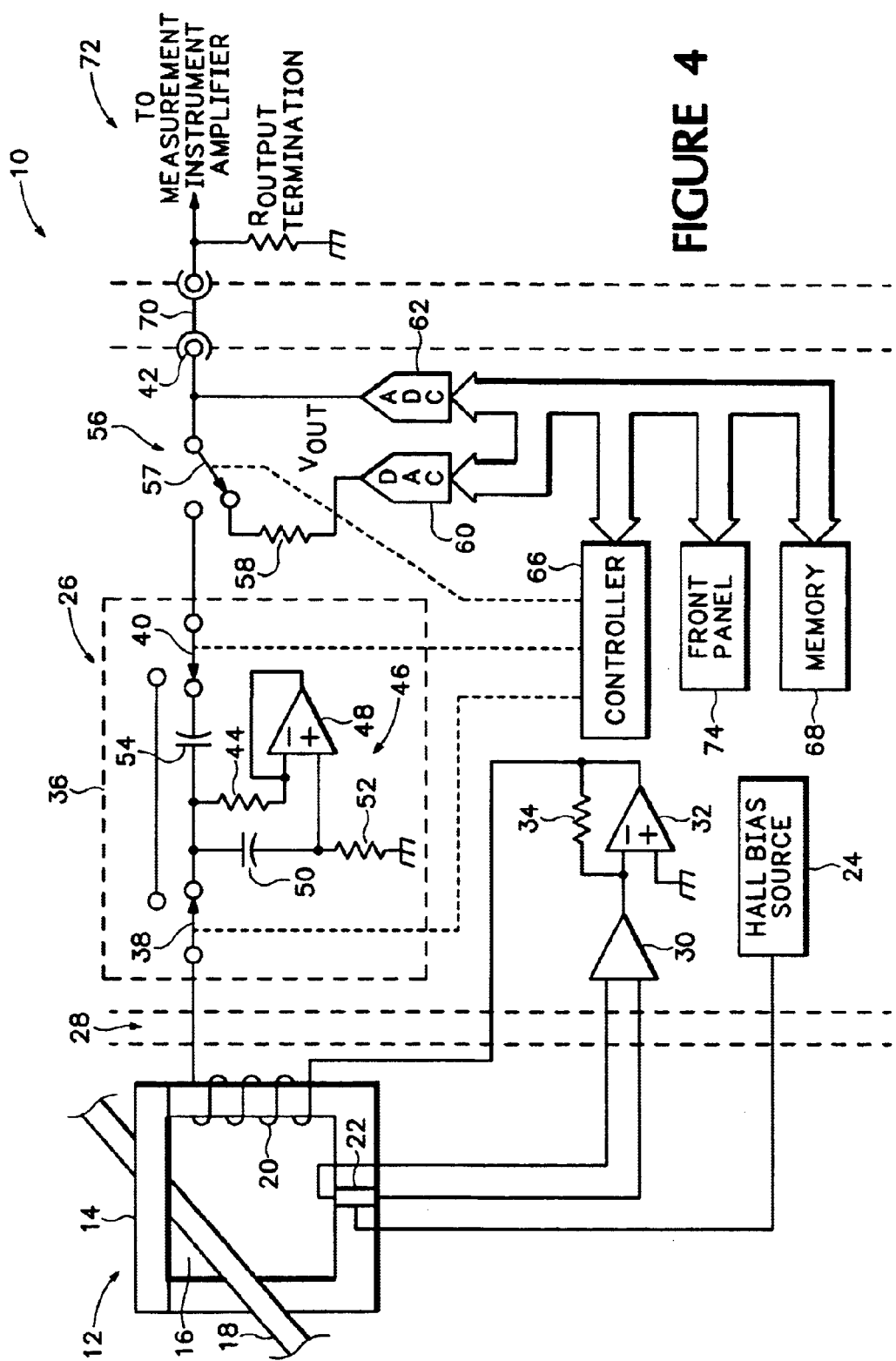

OUTPUT TERMINATION AUTO DETECTION CIRCUIT FOR AN INPUT DEVICE

CROSS-REFERENCE TO RELATED APPLICATION

This application claims the benefit of the U.S. Provisional Application No. 60/428,647, filed Nov. 22, 2002.

BACKGROUND OF THE INVENTION

The present invention is directed generally to the detection of an output termination of a input measurement device and more particularly to an output termination auto detect circuit for an input measurement device, such as current measurement probe, coupled to the input termination of a host measurement instrument.

Oscilloscopes are measurement instruments that provide a visual representation of a measured signal in a time versus amplitude display on a display device, such as a cathode ray tube or liquid crystal matrix display. The input channels of the oscilloscope have input termination resistances which are generally 1 megohm or 50 ohms depending on bandwidth performance. Measurement probes, such as voltage and current probes, are coupled to the input channels of the oscilloscope and have output terminations that are compatible with the input terminations of the input channels. As the bandwidth of oscilloscopes have increased, it became necessary to provide both types of input terminations for the input channels of oscilloscopes. The input termination of the input channel is selectable by the user for the particular measurement probe being used. This can result in terminating the output termination of a measurement probe in the wrong input termination of the input channel resulting in inaccurate signal measurements.

U.S. Pat. No. 5,493,211, titled "Current Probe", describes a current probe measurement system having an A6302 Current Probe, an AM503 Current Probe Amplifier and a TM500 Power Supply that are manufactured and sold by Tektronix, Inc, the assignee of the current invention. The current probe includes a ring-shaped core of magnetic material defining an aperture through which a current carrying conductor is inserted. A multi-turn winding is wrapped around one leg of the core. A thin-film semiconductor Hall Effect device is disposed in the core, perpendicular to the lines of flux in the core. A bias source provides power to the Hall Effect device with the output of the device coupled to the input of an amplifier. The output of the Hall Effect amplifier is coupled to one side of the multi turn winding with the other side of the winding coupled across a load resistor to an input of a scaling output amplifier. The output of the amplifier is coupled via a coxial cable to the input of an oscilloscope.

The current carrying conductor and the winding around the core act as a transformer for inducing an AC current into the winding of the current probe representative of the AC current in the conductor. The Hall Effect device generates an output in response to the magnetic flux in the core representative of the DC or low frequency current in the conductor. The Hall Effect amplifier generates a current that is opposite to the direction of the magnetic field created by the current in the conductor. The current output coupled across the load resistor is representative of the current in the conductor.

FIG. 1 illustrates the scaling amplifier 110 of the AM503 Current Probe Amplifier 112 operating as an output termination auto detect circuit 114. The scaling amplifier 110 is coupled to the input of the oscilloscope 116 input via a coaxial cable 118. The output termination $R_{OUTPUT\ TERMINATION}$ 120 of the scaling amplifer 110 is the input termination of the oscilloscope. The input to the scaling amplifier 110 is coupled to receive and $V_{OFFSET\ ADJUST}$ signal for estimating the output termination of the scaing amplifier. The scaling amplifier 110 has a transfer function, gain (Av) between $V_{OFFSET\ ADJUST}$ and $V_{SOURCE}$, and an output impedance, $Z_{OUT}$, 122. An analog-to-digital converter (ADC) 124 is coupled to the output of the scaling amplifier for converting the output of the amplifier to digital values representative of the voltage at the output. Applying a known input in the form of a $V_{OFFSET\ ADJUST}$ and knowing the gain (Av), the impedance, $Z_{OUT}$, and the output voltage of the scaling amplifier 110, the value of output termination $R_{OUTPUT\ TERMINATION}$ can be calculated using the below equation.

$$R_{OUTPUT\ TERMINATION} = (V_{OUTPUT} * Z_{OUT})/(A_V * V_{OFFSET\ ADJUST} - V_{OUTPUT}) \quad (1)$$

The above described output termination auto detect circuit provides a rough estimate of the output termination of the current probe amplifier system. It can distinguish between a 1 Megohm termination and a shorted termination. However, it cannot accurately determine if the current probe amplifier system is coupled to a 50 ohm termination. This is because the transfer function of the scaling amplifier can vary from device to device, which adds uncertainty to the calculation of $R_{OUTPUT\ TERMINATION}$. For example, it is known that the above output termination auto detect circuit will provide a false 50 ohm termination indication when a 50 ohm termination is coupled to the input of a 50 ohm terminated input of an oscilloscope.

What is needed is an output termination detection circuit that more accurately detects the output termination of the measurement probe (i.e the input termination of the host measurement instrument). The output termination detection circuit provides an indication when the output termination of the measurement probe is improperly terminated.

SUMMARY OF THE INVENTION

Accordingly, the present invention is an output termination auto detection circuit for an input device, such as a measurement probe, having an output terminal coupled to an input of a host instrument, such as an oscilloscope, wherein the host instrument has discrete input resistance terminations and the output termination of the input device is the input termination of the host instrument. In one embodiment, the output termination auto detection circuit has a reference resistance, a signal source and a detection device disposed within the input device. The reference resistance is selectively coupled to the output terminal of the input device. The signal source is coupled to one side of the reference resistance. The detection device, such as an analog-to-digital converter, is coupled to the other side of the reference resistance at a common node between the reference resistance and the input termination resistance of the host instrument for generating a digital value representative of a voltage at the common node. Means are provided for determining the output termination of the input device as a function of at least two digital values representative of the voltage at the common node, the reference resistance and the voltage of the signal source, and generating an output when the output termination of the input device is improperly terminated. A display element is coupled to receive the output of the determining means for indicating an improper output termination of the input device.

The determining means is preferably a controller receiving the digital value representative of the voltage at the common node and at least one digital value representative of the reference resistance and the voltage output of the signal source. In one implementation, the determining means calculates the input termination resistance of the host instrument as a function of the voltage at the common node, the reference resistance and the voltage of the signal source. In a second implementation, the determining means calculates a ratio of the voltage output of the signal source in relation to the voltage at the common node to estimate the output termination resistance of the input device.

The output termination auto detection circuit further includes a switching element having a first contact coupled to the reference resistance, a second contact coupled to signal acquisition circuitry in the input device and a common contact coupled to output terminal of the input device. The signal source may be implemented as a constant DC voltage reference or a DC voltage source coupled to a detection device for generating digital values representative of the DC voltage source. The display element may be replaced with a back-termination circuit that is selectively coupled to the output of the input device for terminating the output of the input device in the proper output termination in response to the output from the determining means.

The objects, advantages and novel features of the present invention are apparent from the following detailed description when read in conjunction with appended claims and attached drawings.

BRIEF DESCRIPTION OF THE DRAWINGS

FIG. 4 is a representative block diagram of a current probe system implementing the output termination auto detection circuit according to the present invention.

DETAILED DESCRIPTION OF THE PREFERRED EMBODIMENT

The circuit of the present invention automatically detects the output termination on a device, such as a current probe amplifier, and take the proper action to prevent a user from making erroneous measurements using a current probe by not having the proper termination value attached to the output of the current probe amplifier. In an event an improper output termination is detected the device may warn the user (LED, display, etc) or switch in circuitry (back termination, buffer, etc.) to correct the situation.

Figure 1:
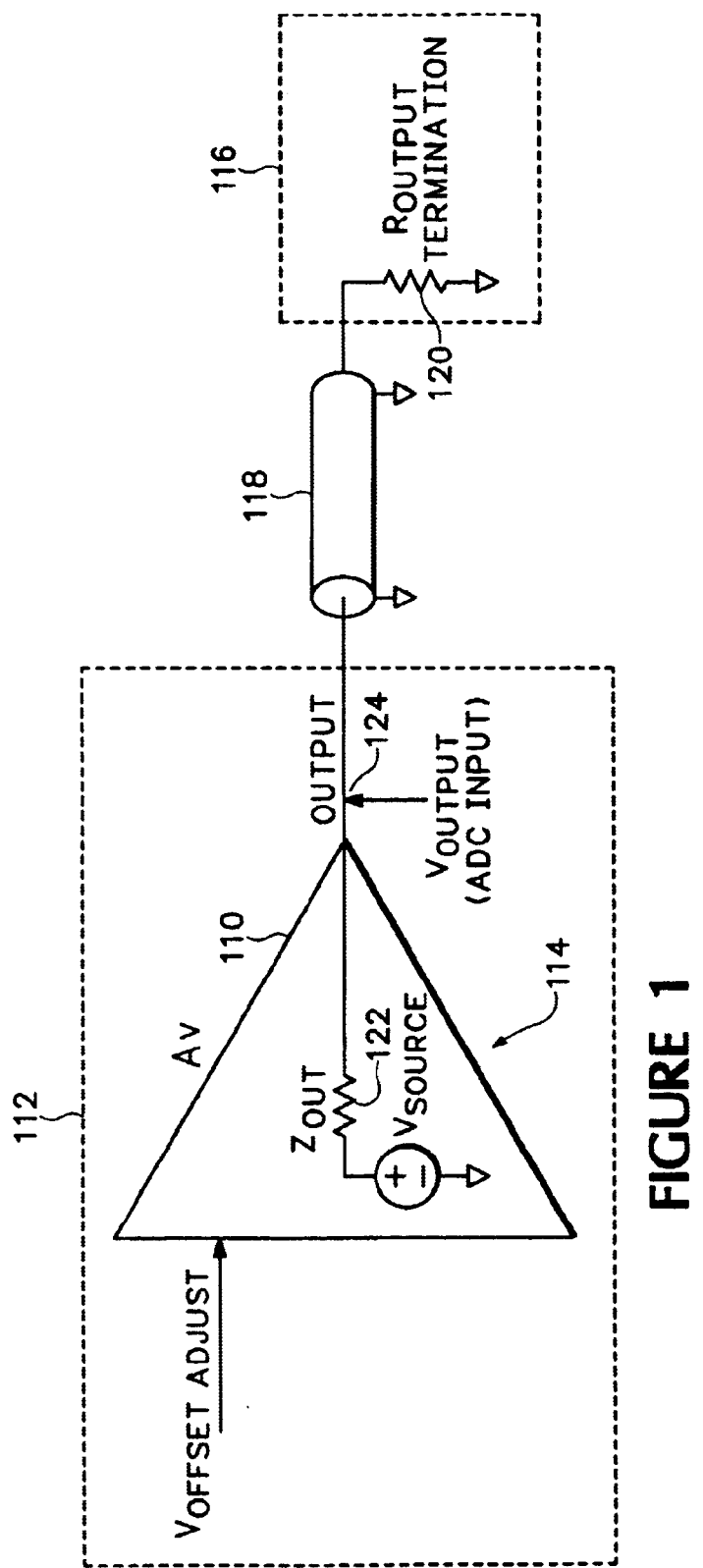
FIG. 1 is a prior art output termination auto detection circuit using an active gain device.
Figure 2:
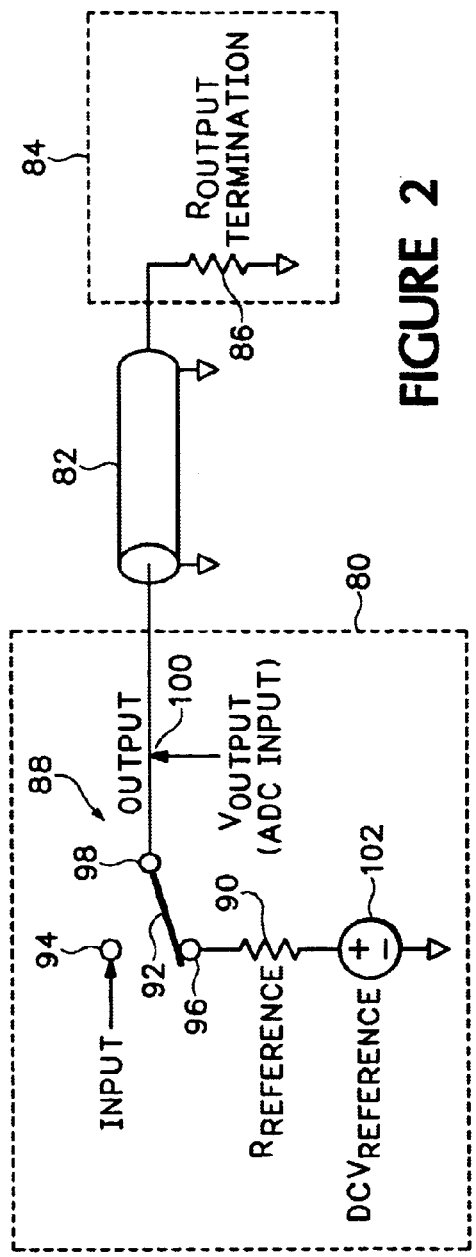
FIG. 2 is a first implementation of the output termination auto detection circuit according to the present invention.

FIG. 2 illustrates a first implementation of detecting the output termination of an input device 80. The input device 80 is coupled via a cable 82, such as coaxial cable or the like, to a host instrument 84, such as an oscilloscope or the like. The input to the host instrument 84 is terminated in a discrete input termination resistance 86, labeled $R_{OUTPUT\ TERMINATION}$, that generally has resistance a value of 50 ohm or 1 Megohm. The input termination resistance 86 of the host instrument 84 is the output termination resistance of the input device 80 when the input device 80 is coupled to the host instrument 84 via the coaxial cable 82. The input device 80 includes the output termination auto detection circuit 88 that includes a reference resistance 90, labeled $R_{REFERENCE}$, that is selectively coupled to the output of the input device via switch or relay 92. One contact 94 of the switch 92 is coupled to receive an input from signal acquisition circuitry (not shown) in the input device 80. A second contact 96 is coupled to one side of the reference resistance 90 and common contact 98 is coupled to the output of the input device. A detection device, such as an analog-to-digital converter (ADC) shown in FIG. 4, is coupled to a common node 100 between the reference resistance 90 and the input resistance termination 86 of the host instrument 84 for digitizing the voltage at the output of the input device. A DC voltage reference 102, labeled $DCV_{REFERENCE}$, is coupled to the other side of the reference resistance 90. The output termination auto detection circuit 88 is shown in the mode to detect the output termination of the input device 80 with the common contact 98 of switch 92 connected to the switch contact 96. $R_{REFERENCE}$ and $R_{OUTPUT\ TERMINATION}$ form a voltage divider driven by the DC voltage reference 102 generating a voltage output, labeled $V_{OUTPUT}$, at the common node 100. The voltage output $V_{OUTPUT}$ at the common node 100 is converted into a digital value representative of the voltage output $V_{OUTPUT}$. Using digital values representative of the reference resistance and DC voltage reference, the value of $R_{OUTPUT\ TERMINATION}$ may be calculated by a controller, such as shown in FIG. 4, using the below equation.

$$R_{OUTPUT\ TERMINATION} = (V_{OUTPUT} * R_{REFERENCE})/(VDC_{REFERENCE} - V_{OUTPUT}) \quad (2)$$

Figure 3:
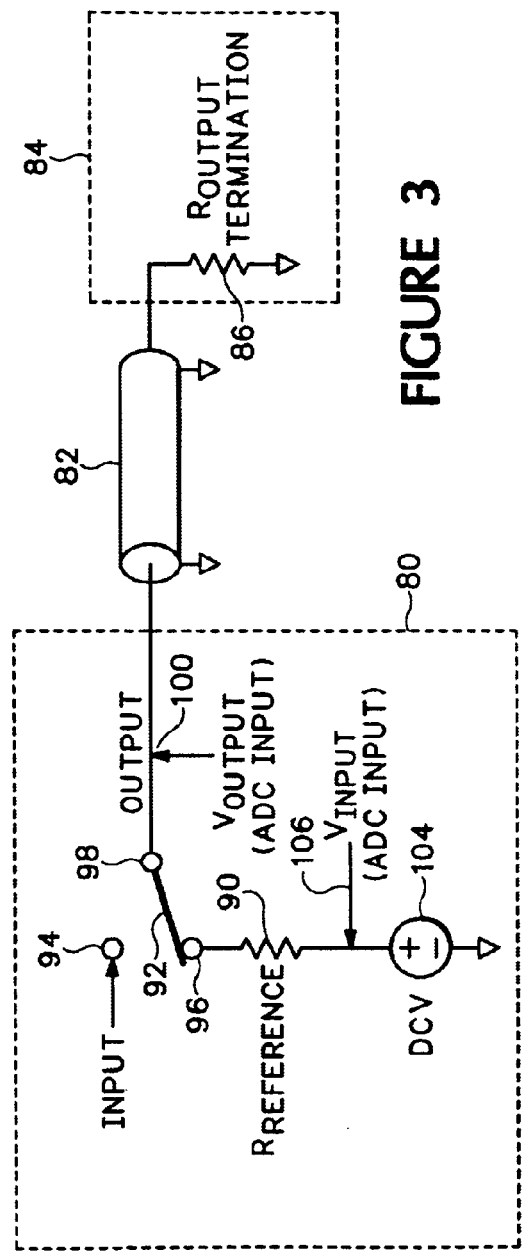
FIG. 3 is a second implementation of the output termination auto detection circuit according to the present invention.

FIG. 3 illustrates another configuration of the output termination auto detection circuit 88 similar to FIG. 2. Common elements from the previous figure are labeled the same in FIG. 3. The DC voltage reference 102 of FIG. 2 is replaced with a DC source 104 having an unknown output, $V_{INPUT}$, that is coupled to one side of the reference resistance 90. A detection device 106, such as an analog-to-digital converter (ADC), is coupled to receive the output, $V_{INPUT}$, of the DC source 104. The ADC 106 produces a digital value representative of the unknown DC voltage, $V_{INPUT}$, produced by the DC source 104. The ADC coupled to the common node 100 detects the $V_{OUTPUT}$ voltage. Using digital values representative of the reference resistance $R_{REFERENCE}$, and the input and output voltages $V_{INPUT}$ and $V_{OUTPUT}$, a controller uses the ratio between $V_{OUTPUT}$ and $V_{INPUT}$ to determine the value of $R_{OUTPUT\ TERMINATION}$ using the below equation.

$$R_{OUTPUT\ TERMINATION} = (V_{OUTPUT} * R_{REFERENCE})/(V_{INPUT} - V_{OUTPUT}) \quad (3)$$

FIG. 4 illustrates a simplified AC/DC current probe system 10 incorporating the output termination auto detection circuit of the present invention. The AC/DC current probe system has a current probe 12 with a split core 14 of magnetic material defining an aperture 16 through which a conductor 18 carrying a current to be measured extends. A multi-turn winding 20 is wrapped around one leg of the core 14. A thin film semiconductor Hall Effect device 22 is disposed within the magnetic core 14. A bias source 24 housed in a current probe amplifier 26 provides power for the Hall Effect device 22 via a multi-conductor cable 28 coupled to a connector on the front panel 29 of the current probe amplifier 26. The Hall Effect device 22 provides a differential input signal to a Hall pre-amplifier 30 in the current probe amplifier 26 via the multi-conductor cable 28. The output of the Hall pre-amplifier 30 is applied to a power amplifier 32 that is provided with a feedback resistor 34. The output of the power amplifier 32 is connected via the multi-conductor cable 28 to one end of the multi-turn winding 20. The opposite end of the winding 20 is connected via the multi-conductor cable 28 to an AC/DC switching circuit 36. The switching circuit 36 has input and output switches 38 and 40 that either directly couples the current signal from the current probe 12 to the output terminal 42 of the current probe amplifier 26 or AC couples the signal to the output terminal 42 of the current probe amplifier 26. The AC coupling circuit has a DC terminating shunt resistor 44 coupled to receive the current input from the current probe 12. The DC terminating shunt resistor 44 is coupled in series with a high inductive value synthesized inductor 46. The synthesized inductor 46 is preferably an operational amplifier 48 having its inverting input node directly coupled to the output node of the amplifier. The DC terminating shunt resistor 44 is coupled to the inverting input node of the amplifier 48. The non-inverting node of the operation amplifier 48 is coupled to the junction between a shunt capacitor 50 that is coupled in parallel with the shunt resistor 44 and the synthesized inductor 46 and a termination resistor 52. The other end of the shunt capacitor 50 is coupled to receive the input from the current probe 12. The current signal is coupled through coupling capacitor 54 to the output switch 40.

The output switch 40 couples the current signal from the signal acquisition circuitry of the AC/DC current probe system 10 consisting of the current probe 12, the Hall Device circuitry 24, 30, 32, 34 and the AC/DC switching circuit 36 to the output termination auto detection circuit 56. The output termination auto detection circuit 56 includes a switch 57, a reference resistor 58, a digital-to analog converter (DAC) 60 and an analog-to-digital converter (ADC) 62. The DAC 60 and ADC 62 are coupled via a controller bus 64 to a controller 66. The controller bus 64 also couples memory to the controller 66. Memory 68 may be RAM and ROM semiconductor devices or part of the controller 66. One contact of the switch 57 is coupled to the switching circuit and the other contact is coupled to the reference resistor 58. The armature of the switch 57 is coupled to the output terminal 42 of the current probe amplifier 26. The input to the ADC 62 is coupled to the armature of switch 57. The output terminal of the current probe amplifier 26 is coupled via a coaxial cable 70 to the input of the measurement instrument 72, such as an oscilloscope or the like. The coaxial cable 70 may include a TekProbe-BNC interface, manufactured and sold by Tektronix, Inc., Beaverton, Oreg. providing a serial bus from th measurement instrument 72 to the current probe amplifier 26.

The current probe amplifier 26 includes a front panel 74 having buttons, knob, LEDs and the like for controlling the operation of the amplifier and connectors for coupling the current probe 12 and measurement test instrument 70 to the amplifier 26. The front panel circuitry is coupled via the controller bus 64 to the controller 66. Depressing the appropriate buttons on the current probe amplifier 26 apply signals to a controller 52 that selectively couple the DC or AC signal path between the input and output of the current probe amplifier 26 and connects the output termination detection circuit to the output of the current probe amplifier 26.

The output termination is detected during an self-adjust routine initiated by the user from the front panel 74. The controller 66 initiates routines that couple the output of the current probe amplifier 26 to the output termination auto detection circuit 56. The output termination auto detection circuit 56 is implemented using a modified version of the ratiometric detect circuit in FIG. 3. The DCV source is the DAC 60 that is provided with a digital value from the controller 66. The voltage at the output of the DAC 60 is coupled across reference resistor 58 that has a preferred value of 50 ohms. The output of the current probe amplifier expects to see 50 ohm at the input of the measurement instrument 72. The voltage divider network made up of the reference resistor and the $R_{Output\ Termination}$ resistor in the measurement instrument 72 should produce a voltage at the output of the current probe amplifier 26 that is one-half of the voltage output from the DAC 60. The ADC 62 converts the voltage at the output of the current probe amplifier 26 to a digital value, which is coupled to the controller 66. The controller 66 compares the digital value of the voltage at the current amplifier output 26 with the digital value of the input to the DAC 60. If the voltage at the output is not equal within a tolerance range to one-half of the voltage from the DAC as represented by the digital values, then the current probe amplifier 26 is not properly terminated for accurate measurements. The controller 66 generates a signal that activates an LED on the front panel to inform the user that the current probe amplifier 26 is improperly terminated.

As previously stated, the output termination auto detection circuit may be configured with switched-in circuitry (back termination, buffer, etc.) to correct an improperly terminated input device. In the AC/DC current probe system 10, switches 38 and 40 may include a further set of contacts that are coupled to back termination circuitry having a set impedance, for example 50 ohms. When the output termination auto detection circuit 56 detects an improper output termination, the controller 66 causes the switches 38 and 40 connect the back termination circuitry to the output terminal of the current probe amplifier 26.

It will be obvious to those having skill in the art that many changes may be made to the details of the above-described embodiments of this invention without departing from the underlying principles thereof. The scope of the present invention should, therefore, be determined only by the following claims.

What is claimed is:

1. An output termination auto detection circuit for an input device having an output terminal coupled to an input of a host instrument having discrete input resistance terminations wherein the output termination of the input device is the input termination of the host instrument comprising:

a reference resistance in the input device selectively coupled to the output terminal of the input device;

a signal source disposed in the input device coupled to the one side of the reference resistance;

a detection device disposed in the input device coupled to the other side of the reference resistance at a common node between the reference resistance and the input termination resistance of the host instrument for generating a digital value representative of a voltage at the common node;

means for determining the output termination of the input device as a function of at least two digital values representative of the voltage at the common node, the reference resistance and the voltage of the signal source, and generating an output when the output termination of the input device is improperly terminated; and a display element coupled to receive the output of the determining means for indicating an improper output termination of the input device.

2. The output termination auto detection circuit as recited in claim 1 wherein the determining means comprises a controller receiving the digital value representative of the voltage at the common node and digital values representative of the reference resistance and a voltage output of the signal source and calculating the input termination resistance of the host instrument as a function of the voltage at the common node, the reference resistance and the voltage of the signal source.

3. The output termination auto detection circuit as recited in claim 1 wherein the determining means comprises a controller receiving the digital value representative of the voltage at the common node and a digital value representative of a voltage output of the signal source and calculating a ratio of the voltage output of the signal source in relation to the voltage at the common node to estimate the output termination resistance of the input device.

4. The output termination auto detection circuit as recited in claim 1 further comprising a switching element having a first contact coupled to the reference resistance, a second contact coupled to signal acquisition circuitry in the input device and a common contact coupled to output terminal of the input device.

5. The output termination auto detection circuit as recited in claim 1 wherein the signal source comprises a constant DC voltage reference.

6. The output termination auto detection circuit as recited in claim 1 wherein the signal source further comprises a DC voltage source having a detection device coupled thereto for generating digital values representative of the voltage output of the DC source.

7. The output termination auto detection circuit as recited in claim 1 or 6 wherein the detection device comprise analog-to-digital converter.

* * * * *